United States Patent [19]

Yatsugi et al.

[11] Patent Number: 4,956,729
[45] Date of Patent: Sep. 11, 1990

[54] VIDEO SIGNAL PREAMPLIFIER CIRCUIT

[75] Inventors: Tomishige Yatsugi; Hiroshi Toeda; Tadashi Takamiya; Norio Minami; Isao Fukushima, all of Ibaraki, Japan

[73] Assignees: Hitachi, Ltd., Tokyo; Hitachi Video Engineering, Ltd., Kanagawa, both of Japan

[21] Appl. No.: 110,424

[22] Filed: Oct. 20, 1987

[30] Foreign Application Priority Data

Oct. 20, 1986 [JP] Japan .................... 61-247407
Feb. 14, 1987 [JP] Japan .................... 61-30664

[51] Int. Cl.$^5$ ...................... G11B 5/02; G11B 15/14
[52] U.S. Cl. ...................................... 360/67; 360/65
[58] Field of Search ............................... 360/65, 67

[56] References Cited

U.S. PATENT DOCUMENTS

| Re. 32,132 | 4/1986 | Nakamura et al. | 360/65 |
| 3,310,637 | 3/1967 | Skov | 360/65 |
| 3,727,011 | 4/1973 | Nickerson et al. | 360/65 |
| 4,255,769 | 3/1981 | Naylor | 360/67 |
| 4,446,493 | 5/1984 | Terui | 360/67 |
| 4,470,020 | 9/1984 | Mohn | 360/67 |

Primary Examiner—Vincent P. Canney
Attorney, Agent, or Firm—Antonelli, Terry, Stout & Kraus

[57] ABSTRACT

A preamplifier circuit for amplifying a video signal reproduced by a magnetic head includes a positive feedback circuit for reducing an input capacitance thereof. A negative feedback circuit may be added thereto for stabilizing an operation of the preamplifier.

2 Claims, 5 Drawing Sheets

GAIN-FREQUENCY CHARACTERISTICS

VIDEO SIGNAL PREAMPLIFIER CIRCUIT

BACKGROUND OF THE INVENTION

The present invention relates to an amplifier circuit and, particularly, to a preamplifier circuit for use in a magnetic recording and reproducing apparatus such as video tape recorder.

In the magnetic recording and reproducing apparatus, the frequency characteristics of a reproduced video signal are generally determined by resonance characteristics defined by an inductance. As such, capacitance of a video head circuit and it is very difficult to obtain desired frequency characteristics therefor. In order to try to overcome this problem, it has been usual to improve the resonance characteristics of the video head circuit by using a damping resistor. FIGS. 1 and 2 show examples of conventional circuits for this purpose, noting that FIG. 1 is disclosed in U.S. Pat. No. 3,513,267. In these figures, a letter L depicts an equivalent inductance of a video head when viewed from an input side of a preamplifier whose gain is A, and C is a parallel capacitance including a stray capacitance of the video head. The high cutoff frequency of a reproduced video signal is substantially determined by a resonance frequency defined by L and C according to the following equation $$fo = \tfrac{1}{2}\pi\sqrt{LC}$$

In order to restrict such frequency characteristics due to resonance and to make a frequency characteristics flat within the video signal frequency band, damping resistors R2 and R1 are employed in the circuits shown in FIGS. 1 and 2, respectively. Among them, since the circuit in FIG. 1 includes the damping resistor R2 inserted into the circuit as a negative feedback resistor, it is possible to reduce the amount of thermal noise which is produced by the resistor. For this reason, the circuit shown in FIG. 1 has been frequently used in current video tape recorders.

In these prior art arrangement, when it is desired to make the frequency band of the reproduced video signal wider to obtain a higher video signal quality, it is necessary to increase the resonance frequency by reducing the inductance L or capacitance C of the video head. In order to reduce the inductance, it is necessary to reduce the number of turns of the head coil, resulting in a reduced induction voltage and a degraded S/N ratio. Alternatively, a reduction of the parallel capacitance is practically impossible since a large part of this is the stray capacitance of the head coil. Therefore, at present, it is almost impossible to obtain flat frequency characteristics for a video signal over a substantially wider frequency range.

SUMMARY OF THE INVENTION

An object of the present invention is to provide a preamplifier for use in a video signal recording and reproducing apparatus in which reproducing frequency characteristics of a video signal are made substantially flat over a substantially wider frequency range without reducing neither the inductance or the parallel capacitance of the video head.

The above object of the present invention is achieved by a provision of a positive feedback circuit composed of a capacitor. With the positive feedback circuit provided between an output terminal of the preamplifier and an input thereof connected to an output of the video head, a capacitance component of an input side impedance of the preamplifier, which includes the stray capacitance of the video head, is at least reduced substantially. It is possible, in the present invention, to use a negative feedback in addition to the positive feedback, if it is necessary.

When the parallel capacitance is made zero equivalently, there is no resonance. When the capacitance is reduced equivalently, the resonance frequency is made higher and damping of the resonance becomes easier. Therefore, it becomes possible that the resonance damping is performed by an input resistance of the preamplifier itself without using any special damping resistor, so that it is possible to widen the video signal frequency band as desired.

DETAILED DESCRIPTION OF THE PREFERRED EMBODIMENTS

Figure 1:
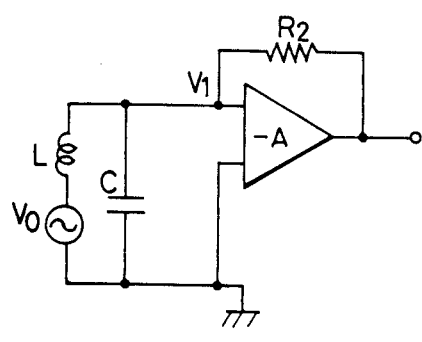
FIGS. 1 and 2 are circuit diagrams of conventional preamplifiers, respectively.
Figure 2:
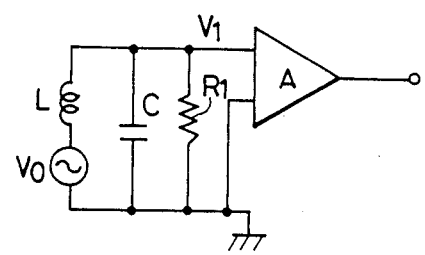
Figure 3:
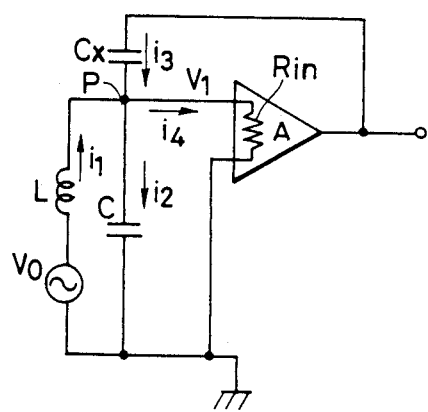
FIG. 3 is a circuit diagram of an embodiment of the present invention.

In FIG. 3, which shows an embodiment of the present invention, an inductance L, a parallel capacitance C and a preamplifier having gain A are common to the conventional circuit shown in FIG. 1 or 2.

According to the present invention, a positive feedback capacitor Cx is provided between an output of the amplifier and an input terminal thereof. In this circuit, an equivalent input resistance is depicted by Rin and Vo and V1 are reproduced signal voltage induced in a video head and an input terminal voltage of the preamplifier, respectively.

Assuming branch currents flowing into and from a junction point p at the input terminal of the preamplifier as i1, . . . i4 as shown, the following equation is established:

$$i4 = i1 - (i2 - i3) \tag{1}$$

where $$i2 = j\omega CV1 \tag{2}$$

$$i3 = j\omega Cx(A-1)V1 \tag{3}$$

Therefore, the equation (1) is rewritten as follow:

$$i4 = i1 - j\omega C'V1 \tag{4}$$

$$\text{where } C' = C - (A-1)Cx \tag{5}$$

Figure 4:
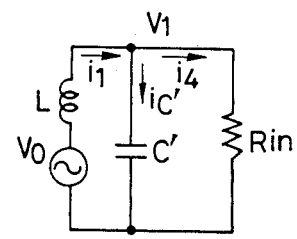
FIG. 4 is an equivalent circuit of the circuit in FIG. 3.

As is clear from the equation (4), the circuit in FIG. 3 can be shown as in FIG. 4 equivalently.

Assuming the following relation $$Cx = C/(A-1) \quad (6)$$

the equivalent capacitance C' becomes zero according to the equation (5). In such case, i4=i1 and the input terminal voltage V1 of the preamplifier can be represented as follows:

$$V1 = [1/(1+j\omega/\omega_0)]Vo \quad (7)$$

where $\omega_o = Rin/L$.

Thus, with the positive feedback circuit composed of the capacitor Cx, it is possible to make the equivalent capacitance in the input side of the preamplifier zero, so that it is possible to eliminate the resonance of the video signal reproducing circuit.

In this circuit construction, the high cutoff frequency of the video signal reproducing circuit is substantially determined by a value of $\omega_o$ in the equation (7). However, since the input resistance Rin of the preamplifier can generally be made large compared with the inductance L of the video head, the high cutoff frequency mentioned above can be very large compared with that of the conventional circuit.

As mentioned above, the circuit including the capacitor Cx must be positive feedback circuit. Otherwise, the term (A-1)Cx in the equation (5) becomes negative, resulting in that the equivalent capacitance C' is larger than C.

Figure 5:
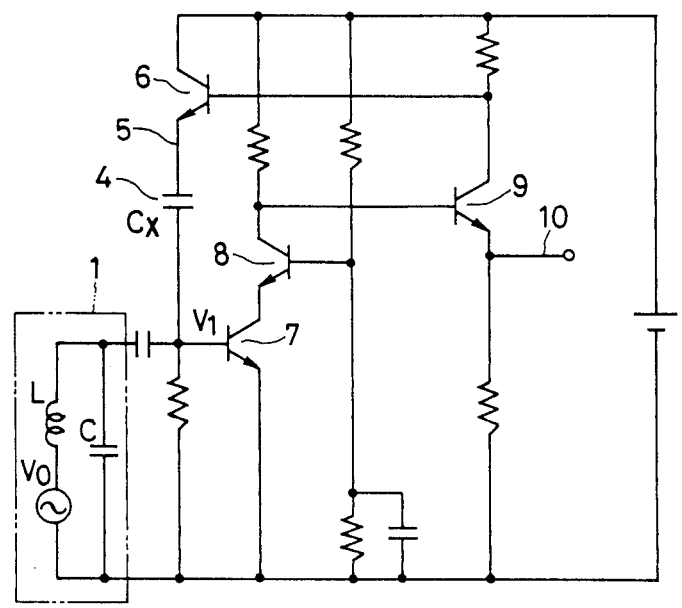
FIG. 5 shows the circuit in FIG. 3 in more detail.

FIG. 5 shows a circuit diagram which is an example of concrete construction of the circuit in FIG. 3. In FIG. 5, a video head 1 has an inductance L and a parallel capacitance C and a positive feedback capacitor 4 has a capacitance Cx. Transistors 7, 8 and 9, which are cascaded, constitute the preamplifier whose output is derived from an emitter 10 of the transistor 9. A collector output of the transistor 9 is connected to a base of a transistor 6 whose emitter 5 is positively fedback through the capacitor 4 to a base input voltage V1 of the transistor 7 as an inphase voltage to the input voltage of the preamplifier.

Thus, assuming that a gain of this circuit which is provided by the transistors 6, 7, 8 and 9 is A, the parallel capacitance with respect to the inductance of the video head can be set to zero equivalently as mentioned with respect to the equation (6). Therefore, the resonance frequency of the preamplifier becomes much higher than that of the conventional circuit and thus the reproduction frequency characteristics of video signal can be made flat over a wider frequency band, resulting in a high quality video signal reproduction. Further, since a resonance peak can be damped by the input resistance of the preamplifier itself, the problem produced by the use of a special damping resistor which is a source of thermal noise is resolved, i.e., the S/N ratio of the reproduced video signal is improved with simple circuit construction.

Described hereinbefore is the embodiment by which the equivalent capacitance C' is made zero. It should be noted that the present invention is not limited thereto and includes circuit constructions by which the equivalent capacitance C' is reduced sufficiently. In such sense, the value of the capacitance Cx is not always that satisfying the equation (6) and it is possible to set it as any of smaller values. For example, it may be possible to set the capacitance Cx such that the latter satisfies the following equation:

$$Cx = \zeta \cdot C/(A-1) \quad (8)$$

where $\zeta < 1$.

In the latter case, the value of C' becomes as follows according to the equations (5) and (8):

$$C' = (1-\zeta)C \quad (9)$$

The resonance frequency $\omega_a$ is thus represented by the following equation:

$$\omega_a = 1/\sqrt{L(1-\zeta)C} \quad (10)$$

That is, it is possible to increase the resonance frequency to $1/\sqrt{1-\zeta}$ times that of the conventional circuit.

In this case, the input terminal voltage V1 of the preamplifier can be represented by the following transfer function:

$$V1 = \{1/[(S/\omega a)^2 + 2\zeta(S/\omega a) + 1]\} \cdot Vo$$

where $\omega_a = 1/\sqrt{LC}$ $$\zeta = L/2Rin$$

$$S = j\omega$$

In order to make the frequency characteristics of V1 substantially flat, $\zeta$, i.e., the damping coefficient, should be equal to or larger than 0.5. When the damping coefficient is 0.5, Rin becomes $\sqrt{L/C'}$.

Since, as mentioned previously, the equivalent capacitance C' can be made small arbitrarily by a selection of the value of $\zeta$ in equation (9), it is possible to satisfy the requirement of the damping coefficient easily.

Figure 6:
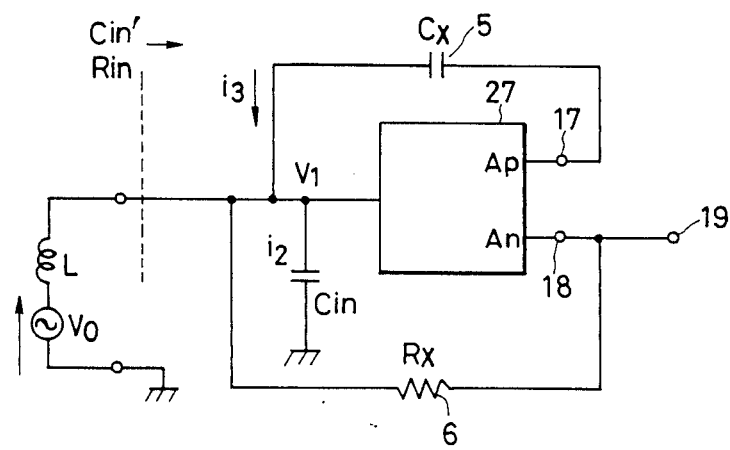
FIG. 6 is a circuit diagram showing a general operation of another embodiment of the present invention.

FIG. 6 shows a block circuit diagram of another embodiment of the present invention.

In FIG. 6, in which the same or corresponding components as those in FIGS. 1 to 5 are depicted by same reference numerals, respectively, a positive feedback capacitor Cx is provided between a positive phase signal output terminal 17 of an amplifier circuit 27 of a preamplifier and an input terminal thereof. A negative feedback resistor Rx is provided between an inverse signal output terminal 18 and the input terminal of the amplifier circuit. Gains of the amplifier circuit 27 when viewed from the positive phase output terminal 17 and the negative phase output terminal 18 are represented by Ap and An, respectively.

This embodiment resolves a possible problem of the aforementioned embodiment that, although the positive feedback gain of the preamplifier in FIG. 3 or 5 must be smaller than unity, when the positive feedback loop gain of the preamplifier becomes unity the circuit in FIG. 3 or 5 becomes unstable. That is, in the embodiment in FIG. 6, the negative feedback circuit composed of the resistor Rx is provided. Therefore, an input resistance Rin of the amplifier circuit 27 can be represented by the following equation:

$$Rin = Rx/(An+1) \quad (11)$$

Therefore, by changing a value of the negative feedback resistor Rx, the input impedance of the amplifier circuit 27 can be set arbitrarily. Thus, in order to make the input voltage V1 at the input terminal of the amplifier circuit constant regardless of frequency, the negative feedback resistance Rx should be defined as follows, by taking the equivalent input capacitance C' into consideration:

$$Rx = (An+1)\sqrt{L/C} \quad (12)$$

Thus, the frequency characteristics of the preamplifier can be made substantially flat over a wider frequency range due to a combination effect of the reduced input capacitance due to positive feedback and the regulation of input resistance due to negative feedback.

Figure 7:
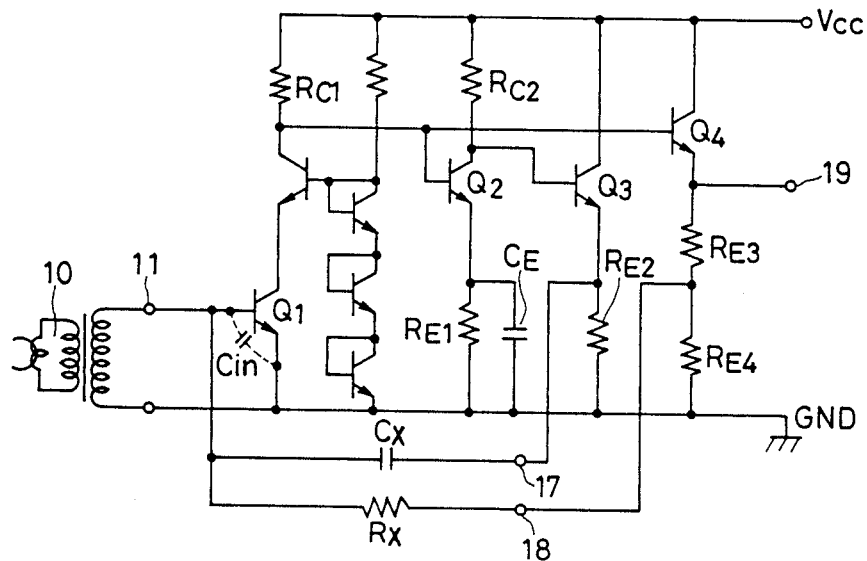
FIG. 7 is a circuit diagram showing a concrete example of the circuit in FIG. 6

FIG. 7 is a circuit diagram showing the circuit construction in FIG. 5 in more detail. In FIG. 7, a reproduced video signal from a magnetic head is applied to the input terminal of the amplifier circuit, i.e., a base of a transistor Q1 and voltage-amplified thereby in an inverse phase with respect to the input signal. The voltage-amplified signal is divided into a positive and negative output sides. The signal in the side of the positive phase is further inverse-amplified by a grounding emitter circuit composed of a transistor Q2 and resistors Rc2 and Re1 to obtain a signal in phase with the input signal. A capacitor Ce connected to an emitter of the transistor Q2 is provided to compensate for the phase of the positive feedback loop. The output signal of the transistor Q2 which is in phase with the input signal is current-amplified by an emitter follower circuit composed of a transistor Q3 and a resistor Re2 and provided at the positive phase output terminal 17. The signal in the inverse output side is current-amplified by an emitter follower circuit composed of a transistor Q4 and resistors Re3 and Re4 and provided at the inverse output terminal 18. The in-phase signal at the positive phase output terminal 17 is positively fed back by the capacitor Cx to the input terminal to reduce the input capacitance C of the transistor Q1 which should have a large emitter region for noise limitation, and for that reason the input capacitance thereof becomes very large compared with the standardized transistor. Therefore, it is very important to reduce the input capacitance, 30 to 50 pF, of the transistor Q1 in order to widen the frequency characteristics of the preamplifier.

The signal at the negative output terminal 18 is negatively fed back through the resistor Rx to the input terminal. Therefore, the input resistance of the transistor Q1 is set to a suitable value with respect to the equivalent input capacitance obtained by the magnetic head and the positive feedback, so that the input impedance of the preamplifier becomes constant regardless of frequency, resulting in flat gain-frequency characteristics over a wide frequency range. In the illustrated embodiment, it is possible to connect a further capacitor between the input terminal of the preamplifier and a grounding point GND to regulate the positive feedback gain.

Figure 8:
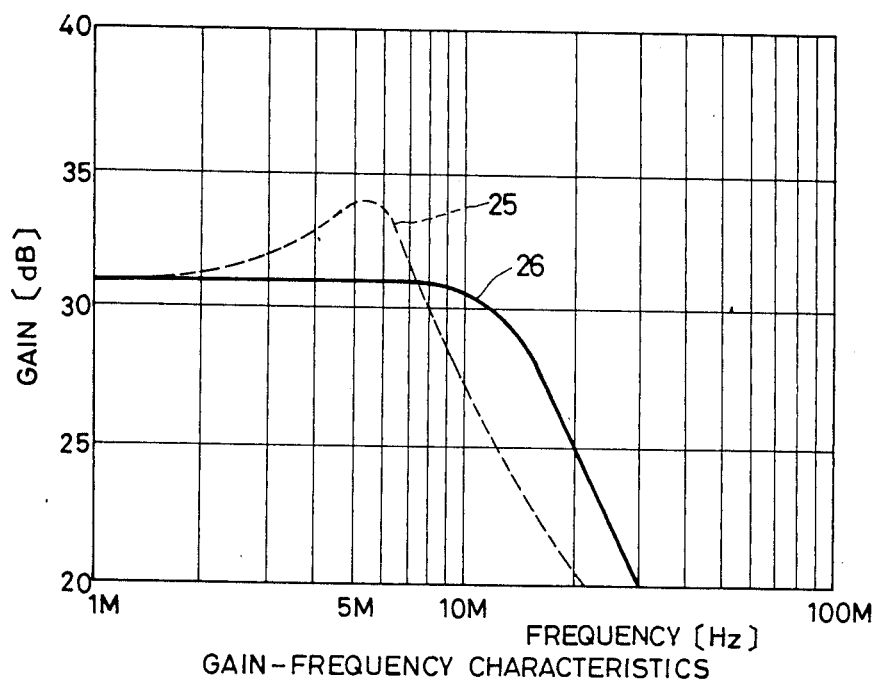
FIG. 8 is a graph showing a characteristics of the embodiment in FIG. 7.

FIG. 8 shows the gain-frequency characteristics of the preamplifier shown in FIG. 6. In FIG. 8, a dotted curve 25 is the characteristic when there is neither positive nor negative feedback provided. This has a peak at around 5.5 MHz due to resonance of the circuit composed of the inductance of the video head and the input capacitance of the amplifier. Thus, the frequency range of the reproduced signal is limited thereby causing the widening of the frequency range to be impossible.

A curve 26 is the characteristic when both the positive and negative feedback circuits are used according to the present invention. As is clear from the curve 26, it is possible to amplify the reproduced signal up to around 10 MHz with substantially flat characteristics.

When it is unnecessary to widen the frequency range, it is possible to employ a larger inductance of the head due to the reduced input capacitance caused by the positive feedback, which means that it is possible to obtain a larger output of the head and to improve the S/N ratio.

Figure 9:
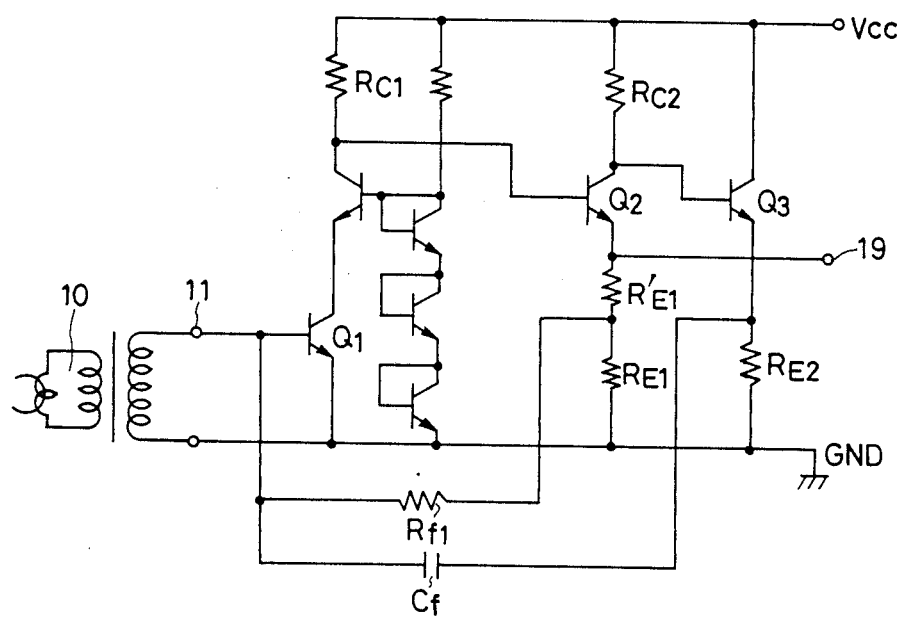
FIG. 9 is a further embodiment of the present invention.

FIG. 9 shows another embodiment of the present invention which is similar to that shown in FIG. 7 except that the transistor Q4 in FIG. 7 is removed and the function thereof is performed by the transistor Q2 concurrently.

In FIG. 9, the signal from the emitter of the transistor Q1 is the inverted output and the signal from the collector thereof is the in phase output. The output terminal 19 is derived from the emitter of the transistor Q2. This circuit construction is simpler than that shown in FIG. 7.

The circuits shown in FIGS. 7 and 9 have no regulating portion, and the capacitor used therein is as small as several pF. Therefore, they can be manufactured in the form of an IC.

As described hereinbefore, according to the present invention, it is possible to at least reduce the input capacitance of the preamplifier, and, therefore, it is possible to exclude the resonance frequency defined by the magnetic head inductance and the input capacitance from the frequency range of the preamplifier. Since the equivalent input resistance can be regulated by an addition of the negative feedback circuit, it is possible to select the sharpness of the resonance suitably and thus it is possible to realize a preamplifier having a very flat gain characteristics over a widened frequency range.

What is claimed is:

1. A preamplifier circuit for amplifying a video signal reproduced by a magnetic head comprising an amplifier circuit having an input terminal connected to said magnetic head and an output terminal, wherein said preamplifier circuit further comprises a positive feedback circuit including a capacitive impedance provided between said input terminal of said amplifier circuit and said output terminal of said amplifier circuit, whereby a capacitance component of an input impedance of said amplifier circuit, including a stray capacitance of said magnetic head, is at least reduced by a positive feedback provided by said positive feedback circuit, and further comprising a negative feedback circuit including a resistive impedance and wherein said amplifier circuit includes an inverted output terminal, said negative feedback circuit being connected between said input terminal and said inverted output terminal of said amplifier circuit.

2. The preamplifier circuit as claimed in claim 1, wherein said capacitive impedance has a value not larger than C/Ap−1) and not less than C/10(Ap−1) and said resistive impedance has a value substantially equal to $(An+1)\sqrt{L/C'}$, where C is a value of an input capacitance of said input terminal of said amplifier circuit, Ap is a voltage gain looked at said output terminal of said amplifier circuit from said input terminal thereof, An is a voltage gain looked at said inverted output terminal from said input terminal, L is an inductance of said magnetic head and C' is a value of said capacitive component.

* * * * *

UNITED STATES PATENT AND TRADEMARK OFFICE
CERTIFICATE OF CORRECTION

PATENT NO. : 4,956,729

DATED : September 11, 1990

INVENTOR(S) : T. Yatsugi et al

It is certified that error appears in the above-identified patent and that said Letters Patent is hereby corrected as shown below:

On the Title Page, left-hand column under Foreign Application Priority Data:

"61-30664" should read --62-30664--.

Signed and Sealed this

Fifteenth Day of September, 1992

Attest:

DOUGLAS B. COMER

*Attesting Officer*     *Acting Commissioner of Patents and Trademarks*